US010862202B1

(12) United States Patent
Yeh et al.

(10) Patent No.: US 10,862,202 B1
(45) Date of Patent: Dec. 8, 2020

(54) INTEGRATED ANTENNA PACKAGE STRUCTURE AND MANUFACTURING METHOD THEREOF

(71) Applicant: Powertech Technology Inc., Hsinchu County (TW)

(72) Inventors: Yun-Hsin Yeh, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 6 days.

(21) Appl. No.: 16/524,197

(22) Filed: Jul. 29, 2019

(30) Foreign Application Priority Data

May 29, 2019 (TW) .............................. 108118588 A

(51) Int. Cl.
*H01Q 1/38* (2006.01)
*H01Q 21/00* (2006.01)
*H01Q 23/00* (2006.01)

(52) U.S. Cl.
CPC ........... *H01Q 1/38* (2013.01); *H01Q 21/0087* (2013.01); *H01Q 23/00* (2013.01)

(58) Field of Classification Search
CPC ...... H01Q 1/38; H01Q 1/2283; H01Q 1/3233; H01Q 21/0087; H01Q 23/00; H01Q 21/28; H01L 23/16; H01L 23/315; H01L 23/3128; H01L 23/562; H01L 23/49838; H01L 2223/6677
See application file for complete search history.

(56) References Cited

U.S. PATENT DOCUMENTS

| 7,944,038 | B2 | 5/2011 | Chiu et al. | |
| 9,007,273 | B2 | 4/2015 | Liao et al. | |
| 9,881,882 | B2 * | 1/2018 | Hsu | .......................... H01L 23/66 |
| 10,438,907 | B2 * | 10/2019 | Hu | .......................... H01L 23/66 |
| 2013/0015563 | A1 | 1/2013 | Lee et al. | |
| 2013/0292809 | A1 | 11/2013 | Yoo et al. | |
| 2020/0118949 | A1 * | 4/2020 | Moallem | ............... H01L 23/562 |

OTHER PUBLICATIONS

"Office Action of Taiwan Counterpart Application," dated Oct. 28, 2019, p. 1-p. 4.

* cited by examiner

*Primary Examiner* — Haissa Philogene
(74) *Attorney, Agent, or Firm* — JCIPRNET

(57) ABSTRACT

An integrated antenna package structure including a circuit board, a chip, an encapsulant and an antenna is provided. The chip is disposed on the circuit board and electrically connected to the circuit board. The encapsulant encapsulates the chip. The antenna is embedded in the encapsulant. The antenna has a first outer surface, the encapsulant has a second outer surface, and the first outer surface is substantially coplanar with the second outer surface. A manufacturing method of an integrated antenna package structure is also provided.

20 Claims, 8 Drawing Sheets

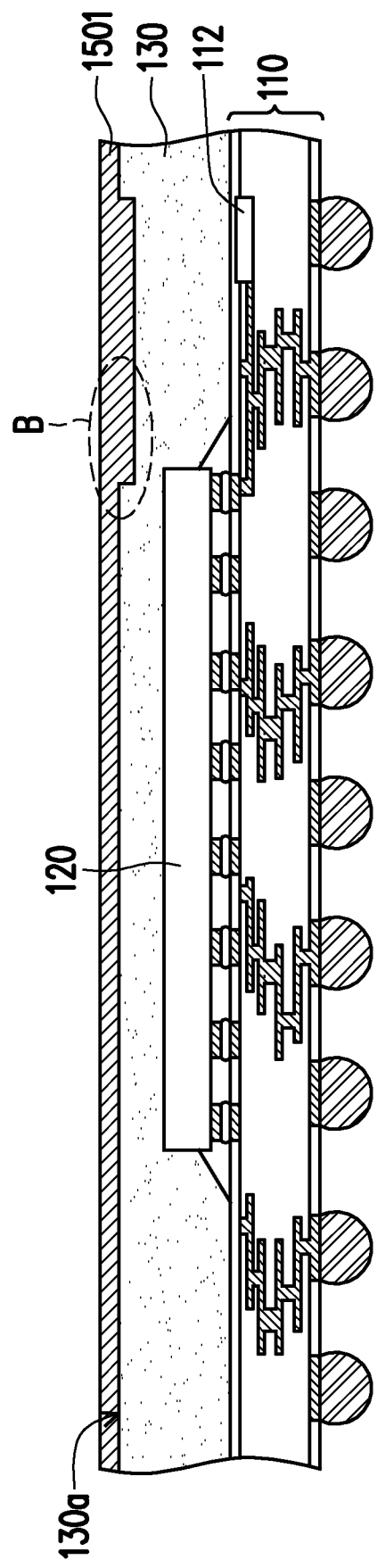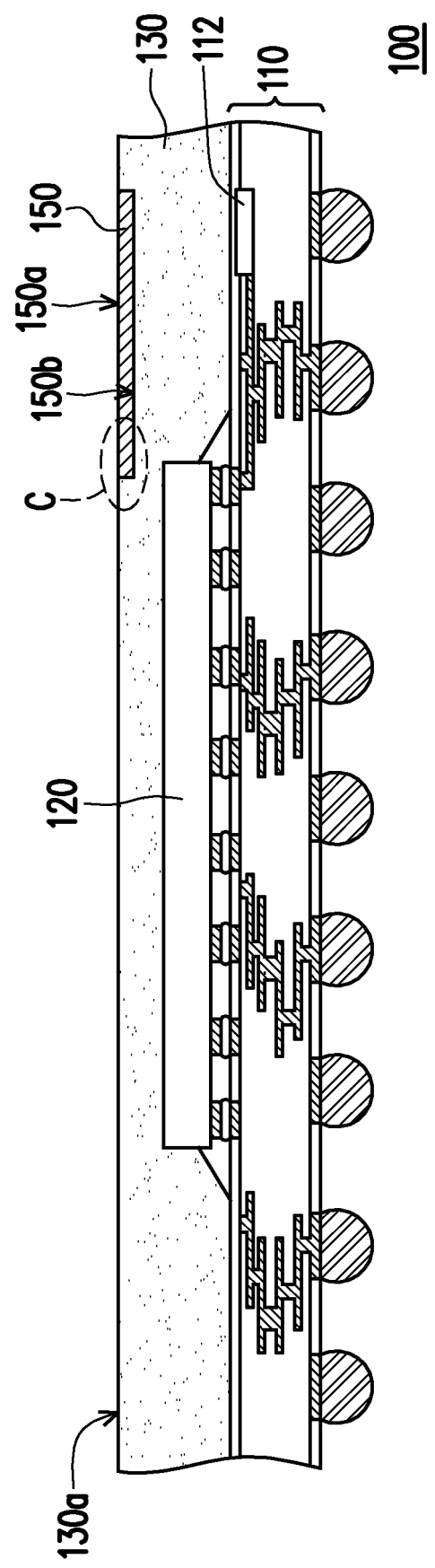

INTEGRATED ANTENNA PACKAGE STRUCTURE AND MANUFACTURING METHOD THEREOF

CROSS-REFERENCE TO RELATED APPLICATION

This application claims the priority benefit of Taiwan application serial no. 108118588, filed on May 29, 2019. The entirety of the above-mentioned patent application is hereby incorporated by reference herein and made a part of this specification.

BACKGROUND

Technical Field

The present invention is related to a package structure and a manufacturing method thereof, and more generally to an integrated antenna package structure and a manufacturing method thereof.

Description of Related Art

In the antenna on package (AoP) structure, an antenna is placed on the surface of the package to provide better transmission quality. In such design, how to improve the bonding between the antenna and the encapsulant and reduce the possibility of its damage is an important issue to be solved.

SUMMARY

The present invention provides an integrated antenna package structure and a manufacturing method thereof, in which the possibility of peeling and damage of the antenna can be reduced.

The present invention provides an integrated antenna package structure including a circuit board, a chip, an encapsulant and an antenna. The chip is disposed on the circuit board and electrically connected to the circuit board. The encapsulant encapsulates the chip. The antenna is embedded in the encapsulant. The antenna has a first outer surface, the encapsulant has a second outer surface, and the first outer surface is substantially coplanar with the second outer surface.

The present invention provides a manufacturing method of an integrated antenna package structure that includes the following steps. A circuit board is provided. A chip is disposed on the circuit board, and the chip is electrically connected to the circuit board. An encapsulant with a recess is formed on the circuit board, so as to encapsulate the chip. An antenna is formed in the recess, wherein the encapsulant has a first outer surface, the antenna has a second outer surface, and the first outer surface is substantially coplanar with the second outer surface.

In view of the above, in the integrated antenna package structure of the present invention, the antenna is embedded in the encapsulant, so the possibility of peeling and damage of the antenna can be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 1D are partial cross-sectional views showing part of a manufacturing method of an integrated antenna package structure according to a first embodiment of the present invention.

DESCRIPTION OF THE EMBODIMENTS

Figure 1A:
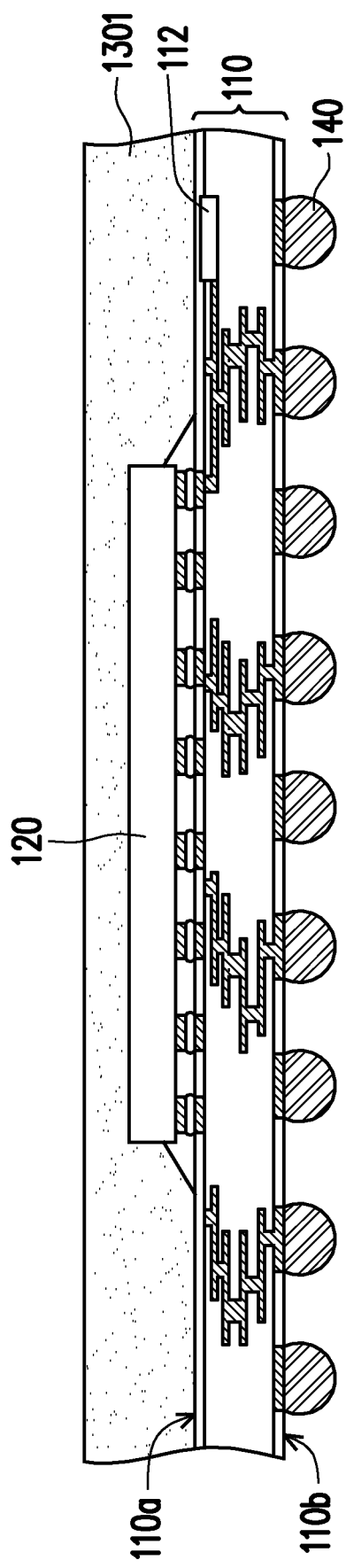

Herein, the directional terms (e.g., top, bottom, right, left, front, back, top, bottom) are merely used as a reference to the drawing and are not intended to imply the absolute orientation.

Unless otherwise expressly stated, any method described herein is not intended to be construed as performing its steps in a particular sequence.

The present invention will be described more fully with reference to the drawings of the embodiments. However, the invention may be embodied in various forms and should not be limited to the embodiments described herein. The thickness, dimension or size will be exaggerated for clarity. The same or similar reference numbers indicate the same or similar elements, and the following paragraphs are not be iterated herein.

FIG. 1A to FIG. 1D are partial cross-sectional views showing part of a manufacturing method of an integrated antenna package structure according to a first embodiment of the present invention. FIG. 1E is an enlarged schematic view of a region A in FIG. 1B. FIG. 1F is an enlarged schematic view of a region B in FIG. 1C. FIG. 1G is an enlarged schematic view of a region C in FIG. 1D.

In the present embodiment, the manufacturing method of an integrated antenna package structure 100 can include the following steps.

Referring to FIG. 1A, a circuit board 110 is provided. The circuit board 110 has a first surface 110a and a second surface 110b opposite to the first surface 110a. The circuit board 110 can be a printed circuit board or a plate having multiple wiring layers, but the present invention is not limited thereto. In the subsequent processes, the circuit board 110 is capable of carrying the structure formed thereon or the device disposed thereon.

Still referring to FIG. 1A, a chip 120 is disposed on the first surface 110a of the circuit board 110, and the chip 120 is electrically connected to the circuit board 110.

In the present embodiment, the chip 120 is disposed on the first surface 110a of the circuit board 110 with the active surface thereof facing the first surface 110a of the circuit board 110. In an embodiment, the chip 120 is disposed on the first surface 110a of the circuit board 110 in a flip-chip bonding manner, so that the chip 120 is electrically connected to the circuit board 110.

In an embodiment, the chip 120 can be a communication chip or a chip with a communication module.

In an embodiment, multiple conductive terminals 140 are formed on the second surface 110b of the circuit board 110, and the conductive terminals 140 are electrically connected to the circuit board 110. For example, the conductive terminals 140 can be formed by a ball placement process and/or a reflow process. For example, the conductive terminals 140 can be solder balls.

The forming sequence of the conductive terminals 140 is not limited by the present invention. In an embodiment, the conductive terminals 140 are formed before the chip 120 is disposed on the circuit board 110. In another embodiment, the conductive terminals 140 are formed after the chip 120 is disposed on the circuit board 110. In an embodiment (not shown), the conductive terminals 140 can be formed after the formation of the antenna 150 (as shown in FIG. 1D).

Figure 1B:
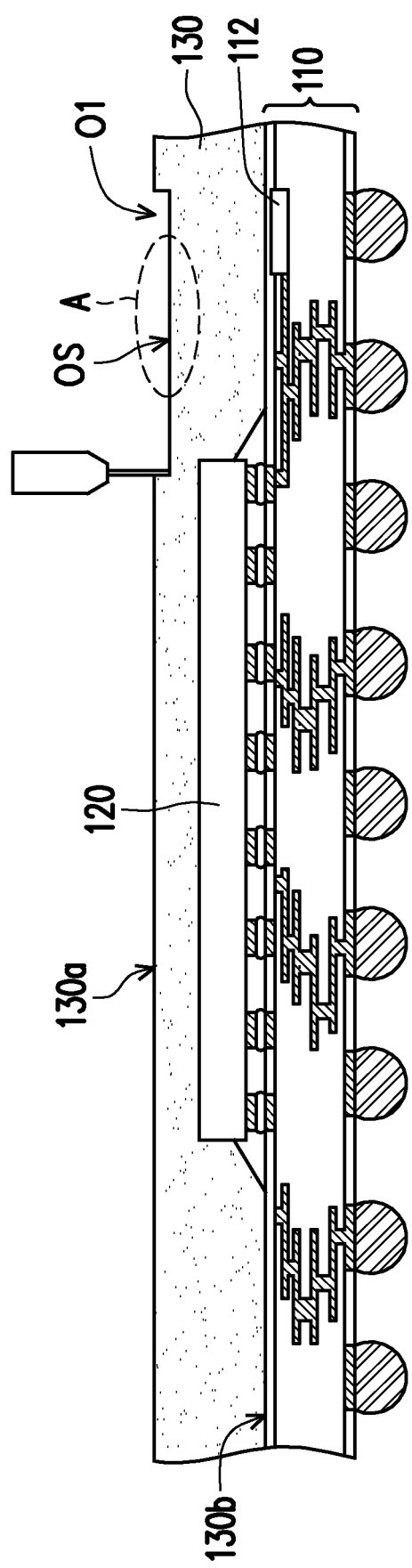
Figure 1E:
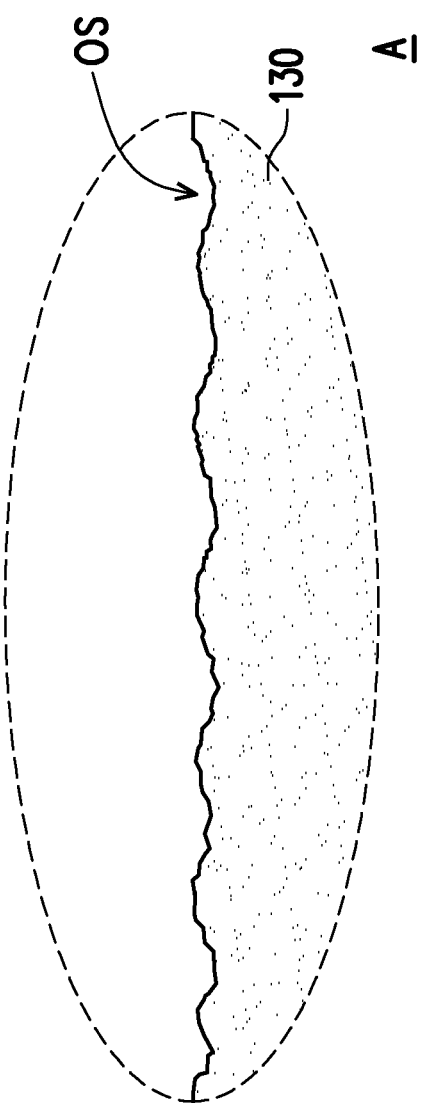
FIG. 1E is an enlarged schematic view of a region A in FIG. 1B.
Figure 1F:
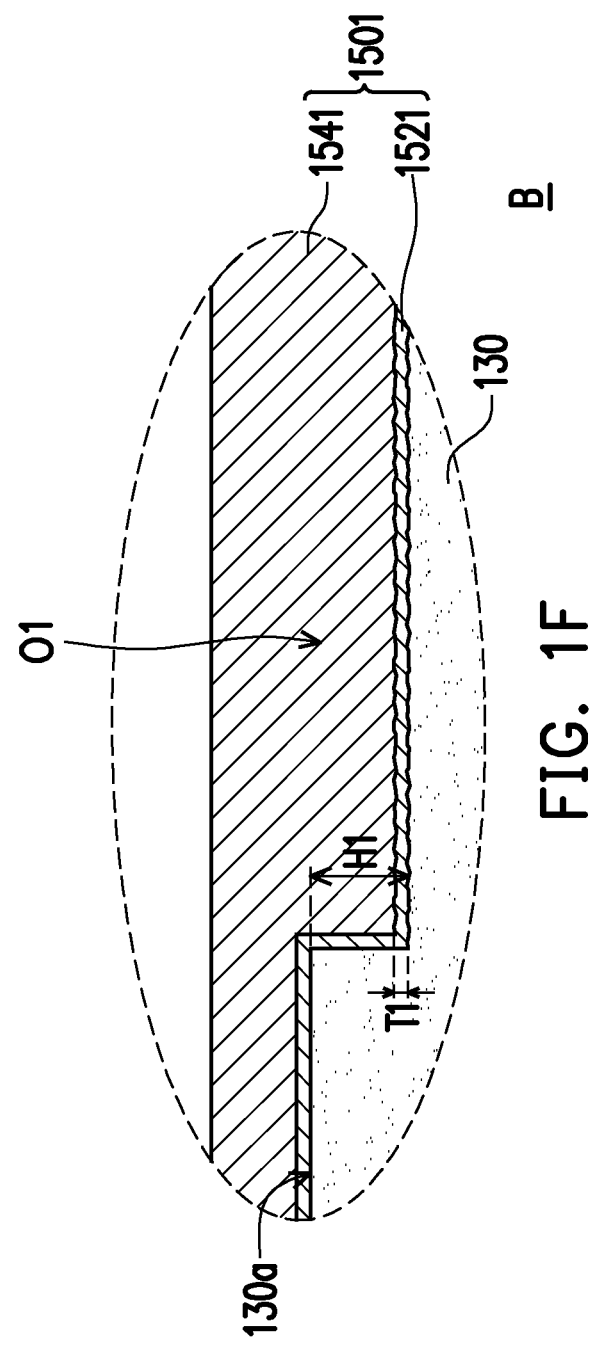
FIG. 1F is an enlarged schematic view of a region B in FIG. 1C.
Figure 1G:
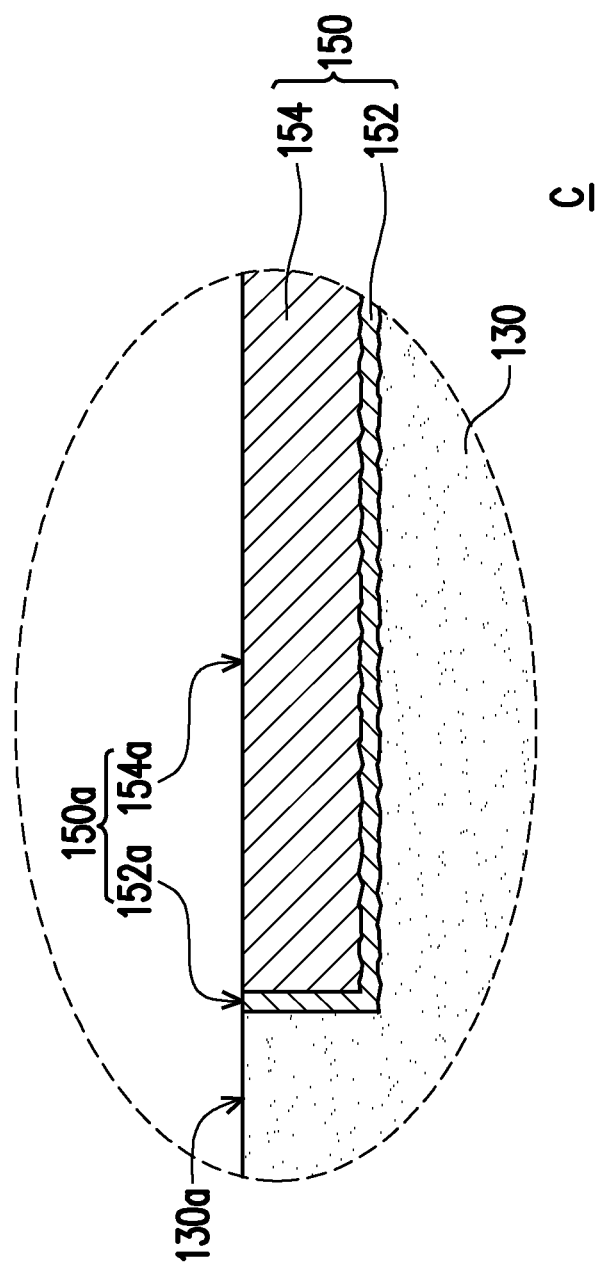
FIG. 1G is an enlarged schematic view of a region C in FIG. 1D.

Referring to FIG. 1A and FIG. 1B simultaneously, after disposing the chip 120, an encapsulant 130 with a recess O1 is formed on the first surface 110a of the circuit board 110, so as to encapsulate the chip 120.

In the present embodiment, the step of forming the encapsulant 130 with the recess O1 can be described as follows.

Referring to FIG. 1A, an encapsulant material 1301 is formed on the first surface 110a of the circuit board 110, so that the encapsulant material 1301 encapsulates the chip 120. The encapsulant material 1301 can completely cover the chip 120. The material of the encapsulant material 1301 can include an epoxy resin, a molding compound or another suitable insulating material. The forming method of the encapsulant material 1301 includes performing a compression molding, a transfer molding or another suitable sealing process.

Thereafter, as shown in FIG. 1B, a portion of the encapsulant material 1301 is removed, so as to form the encapsulant 130 with the recess O1. In the present embodiment, the portion of the encapsulant material 1301 may be removed by a laser peeling, so as to form the recess O1 recessed with respect to the outer surface 130a of the encapsulant 130. The recess O1 formed by the laser peeling may have more variation in the depth or pattern design thereof. For example, the recess O1 recessed with respect to the outer surface 130a of the encapsulant 130 may be formed by a multi-focus laser separation technology.

In the present embodiment, the encapsulant 130 has an outer surface 130a and an inner surface 130b opposite to the outer surface 130a, wherein the outer surface 130a of the encapsulant 130 may be the surface of the encapsulant 130 farthest from the circuit board 110, and the inner surface 130b of the encapsulant 130 may be the surface of the encapsulant 130 closest to the circuit board 110.

In an embodiment, the encapsulant 130 can be a homogeneous material, and such homogeneous material can no longer be separated into different individual materials by a mechanical method (such as crushing, shearing, cutting, sawing, grinding, etc.). In other words, the encapsulant 130 may not have an interface even it is formed by different materials or different processes.

Referring to FIG. 1B and FIG. 1E simultaneously, the bottom surface OS of the recess O1 formed by the laser peeling may be a rough surface as shown in FIG. 1E. In other words, as compared to the outer surface 130a of the encapsulant 130, the bottom surface OS of the recess O1 of the encapsulant 130 may have a greater roughness.

In an embodiment, the depth H1 (shown in FIG. 1F) of the recess O1 is, for example, 15 μm, but the present invention is not limited thereto.

In the present embodiment, the recess O1 does not expose a wiring on the circuit board 110, but the present invention is not limited thereto.

In an embodiment, the bottom surface OS of the recess O1 can be higher than the surface of the chip 120 farthest from the circuit board 110, but the present invention is not limited thereto.

Referring to FIG. 1B to FIG. 1D, after forming the encapsulant 130 with the recess O1, an antenna 150 is formed in the recess O1.

In the present embodiment, the step of forming the antenna 150 can be described as follows.

Referring to FIG. 1B to FIG. 1C and FIG. 1E to FIG. 1F, a conductive material layer 1501 is formed within the recess O1. The conductive material layer 1501 can include a first conductive material layer 1521 and a second conductive material layer 1541.

In an embodiment, the first conductive material layer 1521 can be formed by a sputtering or another suitable method. After forming the first conductive material layer 1521, the second conductive material layer 1541 can be formed on the first conductive material layer 1521 by an electroplating or another suitable method. The material of the first conductive layer 1521 can include titanium, copper, nickel, aluminum, tungsten, cobalt or another suitable conductive material, and the second conductive layer 1541 can include titanium, copper, nickel or another suitable conductive material.

In an embodiment, the first conductive layer 1521 can include a material different from that of the second conductive layer 1541.

In an embodiment, as compared to the first conductive layer 1521, the second conductive layer 1541 can have a higher conductivity.

In an embodiment, the first conductive layer 1521 can be referred to as a seed layer.

In another embodiment, the first conductive layer 1521 can be referred to as a conductive adhesive layer. In other words, as compared to the second conductive layer 1541, the first conductive layer 1521 exhibits a better adhesion to the encapsulant 130.

In an embodiment, the first conductive material layer 1521 can conformally cover the outer surface 130a of the encapsulant 130, but the present invention is not limited thereto.

In an embodiment, the thickness T1 of the first conductive material layer 1521 can be less than the depth H1 of the recess O1. In other words, the first conductive material layer 1521 may not fill up the recess O1.

Referring to FIG. 1C to FIG. 1D and FIG. 1F to FIG. 1G, after forming the conductive material layer 1501, a portion of the conductive material layer 1501 can be removed to form an antenna 150.

In an embodiment, the portion of the conductive material layer 1501 can be removed by a planarization process. The planarization process can include a chemical-mechanical polishing (CMP) process, a mechanical grinding process or another suitable process, but the present invention is not limited thereto.

During the step of removing the portion of the conductive material layer 1501, a portion of the first conductive layer 1521 and a portion of the second conductive layer 1541 can be removed, so as to form a first conductive layer 152 and a second conductive layer 154. The antenna 150 may be constituted by the first conductive layer 152 and second conductive layer 154. That is to say, the antenna 150 can include the first conductive layer 152 and the second conductive layer 154.

The first conductive layer 152 has a first conductive surface 152a, the second conductive layer 154 has a second conductive surface 154a, and the first conductive surface 152a and the second conductive surface 154a can constitute an outer surface 150a of the antenna 150. In other words, the outer surface 150a of the antenna 150 can include the first conductive surface 152a and the second conductive surface 154a. The outer surface 150a of the antenna 150 is the surface of the antenna 150 farthest from the circuit board 110.

After performing the planarization process, the outer surface 150a of the antenna 150 can be substantially coplanar with the outer surface 130a of the encapsulant 130.

In an embodiment, the antenna 150 may not have another layer on the outer surface 150a thereof, but the present invention is not limited thereto.

In the present embodiment, the antenna 150 is formed within the recess O1 of the encapsulant 130. In other words, the antenna 150 can be embedded in the encapsulant 130. Accordingly, the possibility of peeling or damage of the antenna 150 can be reduced.

In the present embodiment, the circuit board 110 can have a coupling terminal 112, the coupling terminal 112 is proximate to the first surface 110a of the circuit board 110, and the coupling terminal 112 is electrically connected to the chip 120.

In the present embodiment, the coupling terminal 112 can be physically insulated from the antenna 150, while the coupling terminal 112 is electrically coupled to the antenna 150. In other words, the electromagnetic signal can be transmitted between the coupling terminal 112 and the antenna 150 by means of inductive coupling.

In an embodiment, a conductive material is not present between the coupling terminal 112 and the antenna 150, and the projection area of the coupling terminal 112 on the circuit board 110 is overlapped with the projection area of the antenna 150 on the circuit board 110.

In the present embodiment, the antenna 150 can have an inner surface 150b opposite to the outer surface 150a. The inner surface 150b can be the surface of the antenna 150 closest to the bottom surface OS of the recess O1. In an embodiment, the inner surface 150b of the antenna 150 can be in physical contact with the bottom surface OS of the recess O1.

In the present embodiment, the surface morphology of the inner surface 150b of the antenna 150 can correspond to the surface morphology of the bottom surface OS of the recess O1. That is to say, the roughness of the inner surface 150b of the antenna 150 can be greater than the roughness of the outer surface 150a of the antenna 150.

In the present embodiment, the inner surface 150b of the antenna 150 is a rough surface. Accordingly, the fitting between the antenna 150 and the encapsulant 130 can be improved, and the possibility of peeling of the antenna 150 can be reduced.

After the above process, the fabrication of the integrated antenna package structure 100 of the present embodiment can be substantially completed. The integrated antenna package structure 100 includes a circuit board 110, a chip 120, an encapsulant 130 and an antenna 150. The chip 120 is disposed on and electrically connected to the circuit board 110. The encapsulant 130 encapsulates the chip 120. The antenna 150 is embedded in the encapsulant 130. The antenna 150 has an outer surface 150a. The encapsulant 130 has an outer surface 130a. The outer surface 150a of the antenna 150 is substantially coplanar with the outer surface 130a of the encapsulant 130.

In the integrated antenna package structure 100, since the antenna 150 is embedded in the encapsulant 130, the possibility of peeling or damage of the antenna 150 can be reduced.

Figure 2A:
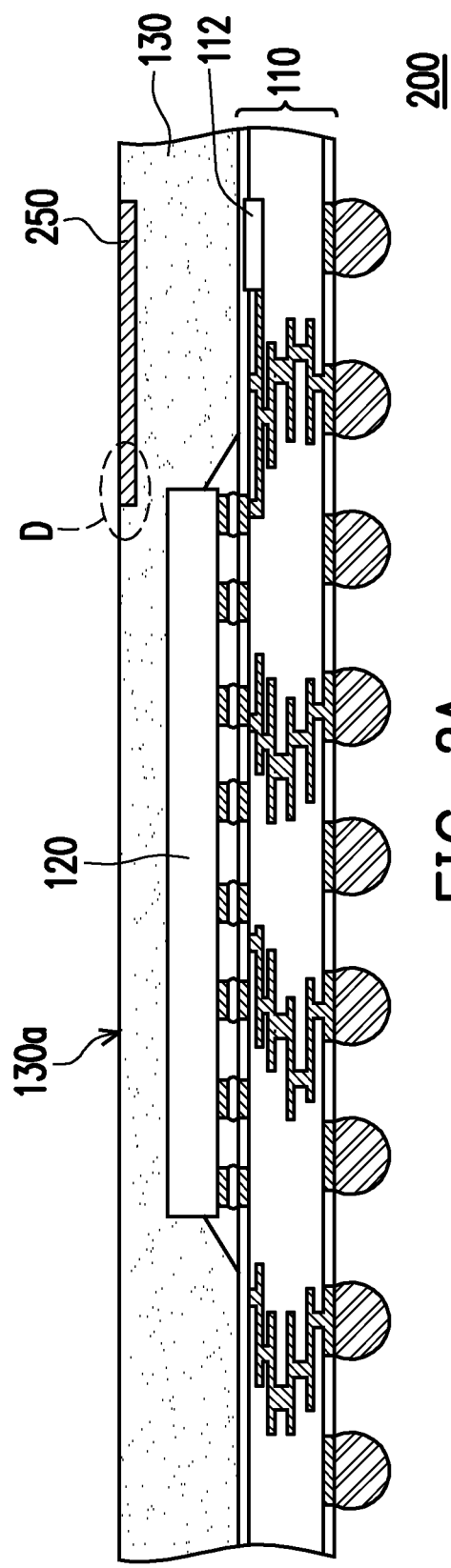
FIG. 2A is a partial cross-sectional view showing part of a manufacturing method of an integrated antenna package structure according to a second embodiment of the present invention.

FIG. 2A is a partial cross-sectional view showing part of a manufacturing method of an integrated antenna package structure according to a second embodiment of the present invention.

Figure 2B:
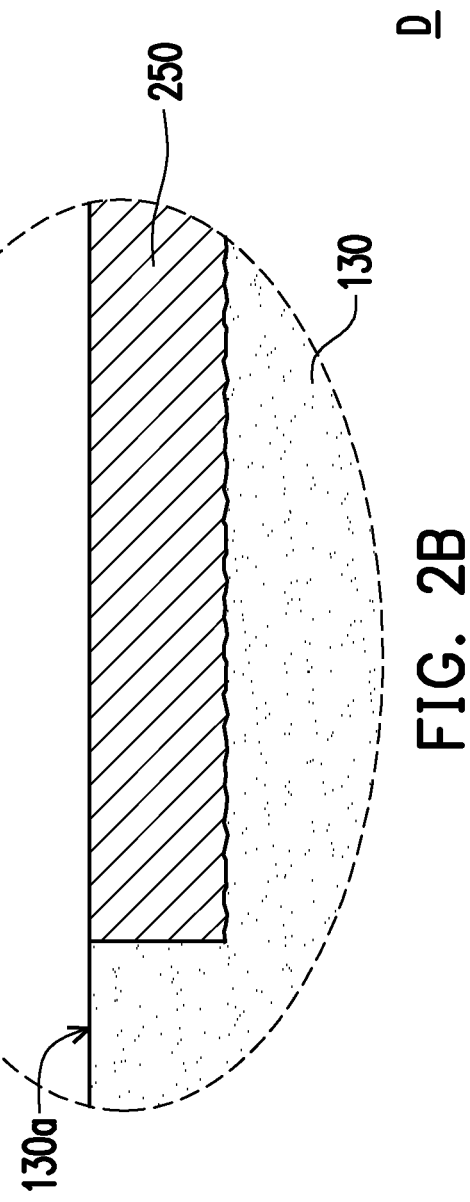
FIG. 2B is an enlarged schematic view of a region D in FIG. 2A.

FIG. 2B is an enlarged schematic view of a region D in FIG. 2A. The integrated antenna package structure 200 of this embodiment is similar to the integrated antenna package structure 100 of the first embodiment, in which similar elements are denoted by the same reference numerals and are assumed to have similar functions, materials or forming methods, so the descriptions thereof are omitted hereinafter. Specifically, FIG. 2A to FIG. 2B are partial cross-sectional views showing part of a manufacturing method of the integrated antenna package structure following the step of FIG. 1B.

As shown in FIG. 2A, following the step of forming an encapsulant 130 with a recess O1 in FIG. 1B, an antenna 250 is formed within the recess O1.

In the present embodiment, the step of forming the antenna 250 can be described as follows.

Referring to FIG. 2A, the antenna 250 can be formed by a printing process.

For example, a silver paste, an aluminum paste or another suitable conductive paste can be filled into the recess O1. Then, the conductive paste in the recess O1 can be solidified to form the antenna 250.

Figure 3A:
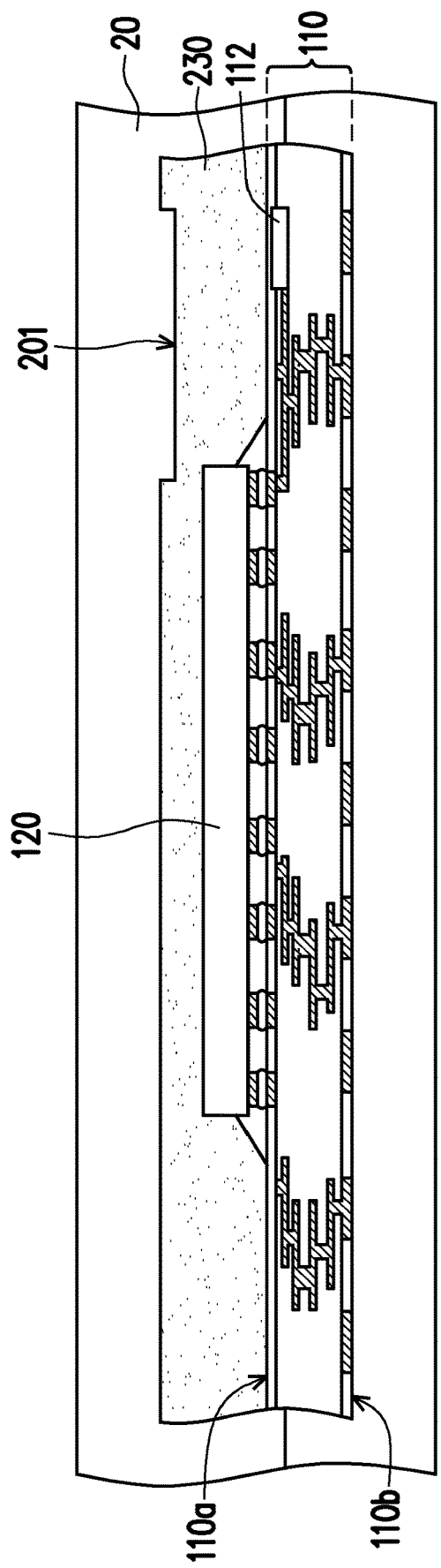
FIG. 3A to FIG. 3B are partial cross-sectional views showing part of a manufacturing method of an integrated antenna package structure according to a third embodiment of the present invention.
Figure 3B:
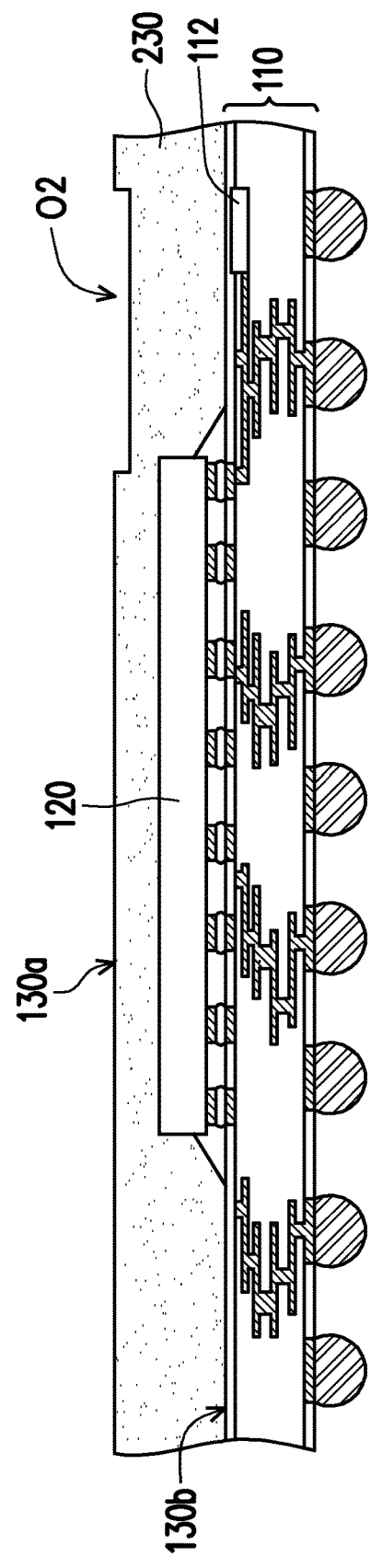

FIG. 3A to FIG. 3B are partial cross-sectional views showing part of a manufacturing method of an integrated antenna package structure according to a third embodiment of the present invention. The integrated antenna package structure of this embodiment is similar to the integrated antenna package structure 100 of the first embodiment, in which similar elements are denoted by the same reference numerals and are assumed to have similar functions, materials or forming methods, so the descriptions thereof are omitted hereinafter.

Referring to FIG. 3A, similar to the step of FIG. 1A, a circuit board 110 is provided, and circuit board 110 can have a coupling terminal 112. Thereafter, a chip 120 is disposed on the first surface 110a of the circuit board 110. The chip 120 is electrically connected to the circuit board 110. Thereafter, an encapsulant 230 with a recess O2 is formed on the first surface 110a of the circuit board 110, so as to encapsulate the chip 120.

Referring to FIG. 3A and FIG. 3B simultaneously, in the present embodiment, the step of forming the encapsulant 230 with the recess O2 can be described as follows.

First, a mold 20 with a protrusion 201 is provided. Thereafter, a molding process is performed with the mold 20, so as to form the encapsulant 230 with the recess O2, and the shape of the protrusion 201 corresponds to the shape of the recess O2. Afterwards, the mold 20 is removed to form the encapsulant 230 with the recess O2.

In an embodiment, the mold 20 can also be a mold set having multiple mold parts assembled together, but the present invention is not limited thereto. As long as the protrusion 201 of the mold 20 has a shape corresponding to the shape of the recess O1, such mold can fall within the scope of the present invention.

In an embodiment, after removing the mold 20, multiple conductive terminals 140 can be formed on the second surface 110b of the circuit board 110. In the present embodiment, the encapsulant 230 having the recess O2 can be directly formed by using the mold 20 with the protrusion 201. Therefore, in this embodiment, the material usage can be further reduced and the process steps can be further simplified.

It is noted that, the subsequent steps may be similar to steps of FIG. 1C and FIG. 1D of the first embodiment or the step of FIG. 2C of the second embodiment. That is, in the present embodiment, an electroplating process or a printing process can be performed to form an antenna within the recess O2, so the subsequent steps are not described herein.

FIG. 4A to FIG. 4D are partial cross-sectional views showing part of a manufacturing method of an integrated antenna package structure according to a fourth embodiment of the present invention. The integrated antenna package structure 300 of this embodiment is similar to the integrated antenna package structure 100 of the first embodiment, in which similar elements are denoted by the same reference numerals and are assumed to have similar functions, materials or forming methods, so the descriptions thereof are omitted hereinafter.

Figure 4A:
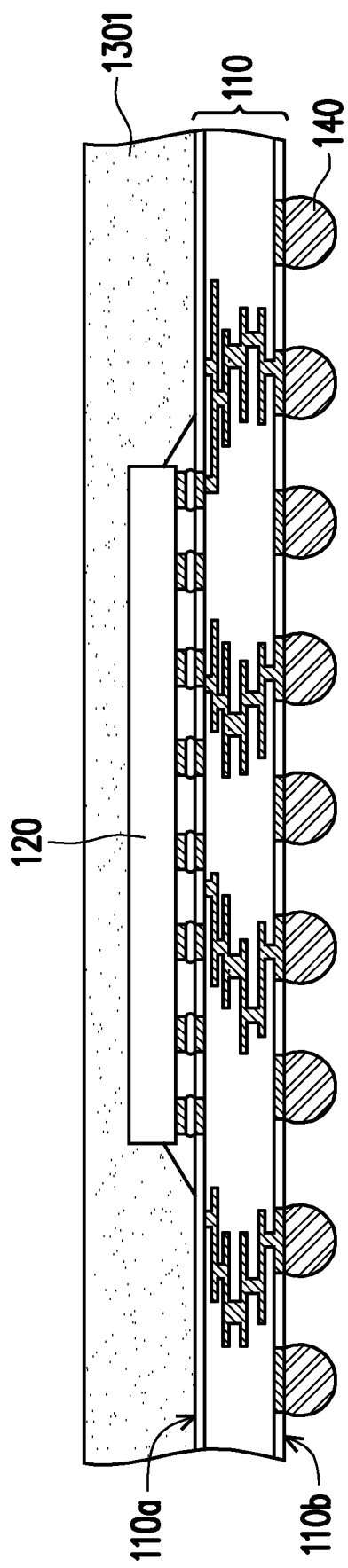
FIG. 4A to FIG. 4D are partial cross-sectional views showing part of a manufacturing method of an integrated antenna package structure according to a fourth embodiment of the present invention.

Referring to FIG. 4A, similar to the step of FIG. 1A, a circuit board 110 is provided. Thereafter, a chip 120 is disposed on the first surface 110a of the circuit board 110. The chip 120 is electrically connected to the circuit board 110. Thereafter, an encapsulant material 1301 is formed on the first surface 110a of the circuit board 110, so as to encapsulate the chip 120. Besides, multiple conductive terminals 140 are further formed on the second surface 110b of the circuit board 110.

Figure 4B:
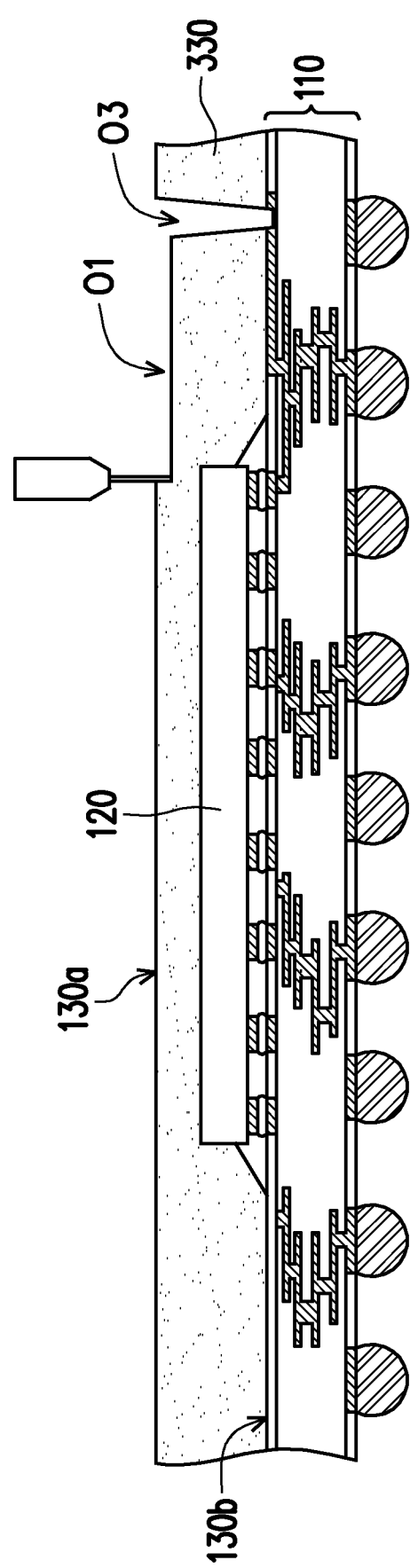

Referring to FIG. 4B, similar to the step of FIG. 1B, a portion of the encapsulant material 1301 is removed by a laser peeling, so as to form an encapsulant 330 having a recess O1 and an opening O3, wherein the opening O3 penetrates through the encapsulant 330, and the recess O1 is overlapped with the opening O3. In other words, the recess O1 and the opening O3 can be formed in the same step, so the process steps can be simplified. The opening O3 can expose the circuit board 110.

Figure 4C:
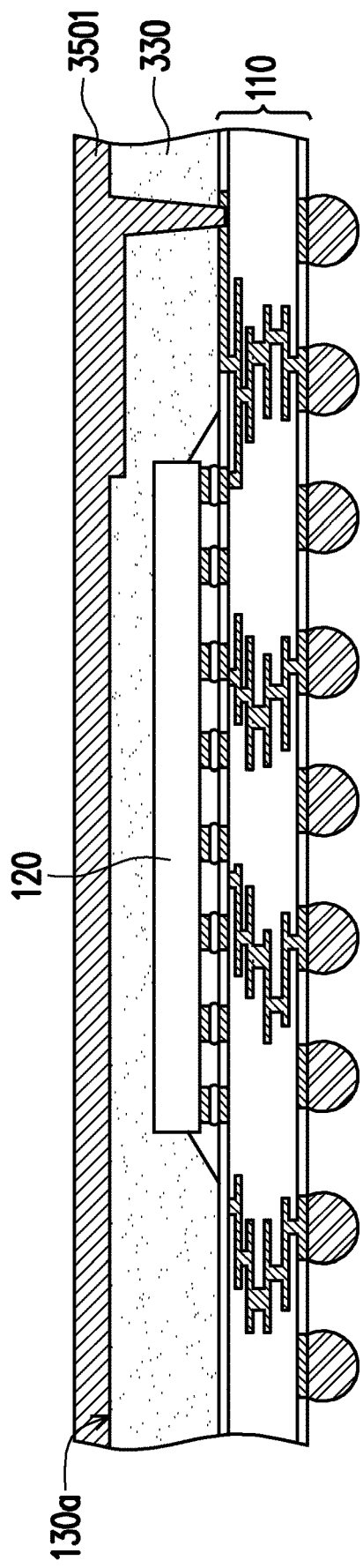
Figure 4D:
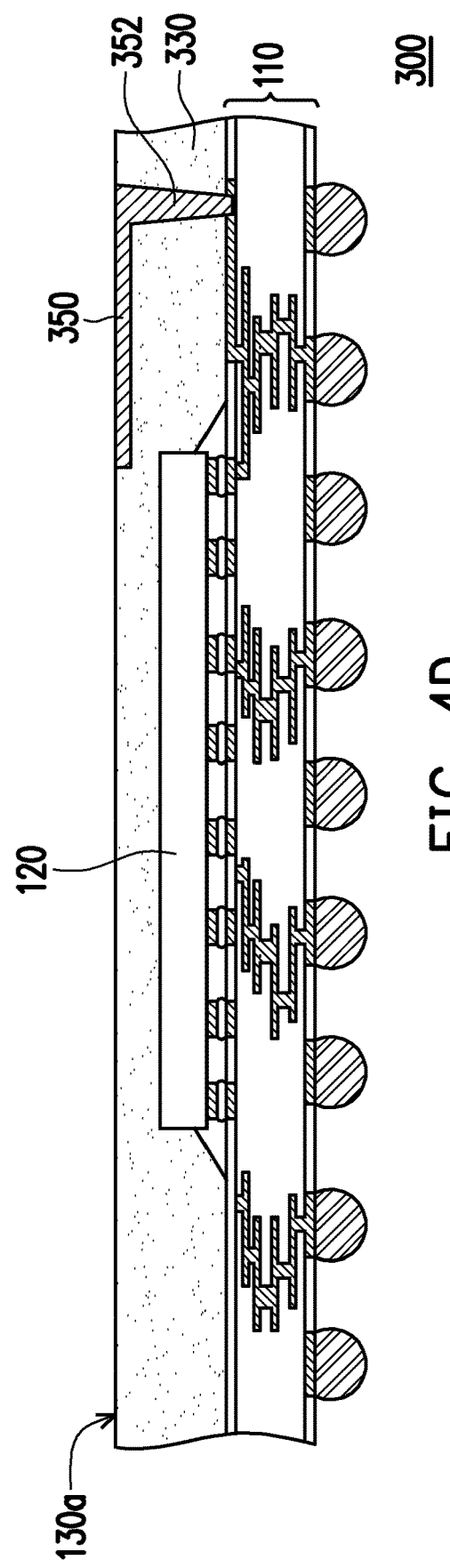

Referring to FIG. 4C and FIG. 4D, similar to the steps of FIG. 1C and FIG. 1D, a portion of the conductive material layer 3501 is removed, so as to form a conductive connector 352 and an antenna 350. The method of forming the conductive material layer 1501 includes performing an electroplating, for example. The conductive connector 352 can penetrate through the encapsulant 330, and the circuit board 110 is electrically connected to the antenna 350 through the conductive connector 352. Thus, the signal of the chip 120 can be transmitted to the antenna 350 via the circuit board 110 and the conductive connector 352. It is noted that, in the embodiment (not shown), similar to the step of FIG. 2C, after forming the encapsulant 330 with the recess O1 and the opening O3, a printing process can be performed to form the antenna 350, and the details are not iterated herein.

In summary, in the integrated antenna package structure of the present invention, the antenna is embedded in the encapsulant, so the possibility of the peeling and damage of the antenna can be reduced. Further, in the present invention, the antenna can be formed by the mold with a protrusion or by a printing process, so the material usage can be reduced and the process steps can be simplified.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An integrated antenna package structure, comprising:
   a circuit board;
   a chip, disposed on the circuit board and electrically connected to the circuit board;
   an encapsulant, encapsulating the chip; and
   an antenna, embedded in the encapsulant, wherein
   the encapsulant has a first outer surface;
   the antenna has a second outer surface; and
   the first outer surface is substantially coplanar with the second outer surface.

2. The integrated antenna package structure of claim 1, wherein the encapsulant is a homogeneous material.

3. The integrated antenna package structure of claim 1, wherein the chip is physically insulated from the antenna.

4. The integrated antenna package structure of claim 3, wherein
   the circuit board has a coupling terminal;
   the coupling terminal is electrically connected to the chip; and
   the coupling terminal is electrically coupled to the antenna.

5. The integrated antenna package structure of claim 4, wherein a conductive material is not present between the coupling terminal and the antenna, and the coupling terminal is overlapped with the antenna.

6. The integrated antenna package structure of claim 1, wherein the antenna further has a second inner surface opposite to the second outer surface, and a roughness of the second inner surface is greater than a roughness of the second outer surface.

7. The integrated antenna package structure of claim 1, wherein
   the antenna comprises a first conductive layer and a second conductive layer;
   the second conductive layer is disposed between the first conductive layer and the encapsulant;
   the first conductive layer has a first conductive surface;
   the second conductive layer has a second conductive surface; and
   the first conductive surface and the second conductive surface constitute the second outer surface.

8. The integrated antenna package structure of claim 7, wherein a material of the first conductive layer is different from a material of the second conductive layer.

9. The integrated antenna package structure of claim 1, wherein the chip is electrically connected to the antenna.

10. The integrated antenna package structure of claim 1, further comprising:
    a conductive connector, penetrating through the encapsulant, wherein the circuit board is electrically connected to the antenna through the conductive connector.

11. A manufacturing method of an integrated antenna package structure, comprising:
    providing a circuit board;

disposing a chip on the circuit board, the chip being electrically connected to the circuit board;

forming an encapsulant with a recess on the circuit board, so as to encapsulate the chip; and forming an antenna in the recess, wherein
the encapsulant has a first outer surface;
the antenna has a second outer surface; and
the first outer surface is substantially coplanar with the second outer surface.

12. The manufacturing method of claim 11, wherein the step of forming the encapsulant with the recess comprises:
forming an encapsulant material on the circuit board to encapsulate the chip; and
removing a portion of the encapsulant material, so as to form the encapsulant with the recess.

13. The manufacturing method of claim 12, wherein the step of removing the portion of the encapsulant material comprises performing a laser peeling.

14. The manufacturing method of claim 12, wherein the recess does not expose the circuit board after removing the portion of the encapsulant material.

15. The manufacturing method of claim 12, wherein the step of forming the encapsulant with the recess further comprises:
removing another portion of the encapsulant material to form an opening that penetrates through the encapsulant.

16. The manufacturing method of claim 15, wherein the recess is overlapped with the opening.

17. The manufacturing method of claim 16, wherein the recess and the opening are formed in the same step.

18. The manufacturing method of claim 11, wherein the step of forming the encapsulant with the recess comprises:
providing a mold with a protrusion;
performing a molding process with the mold, so as to form the encapsulant with the recess, wherein a shape of the protrusion corresponds to a shape of the recess; and
removing the mold after performing the molding process.

19. The manufacturing method of claim 11, wherein the step of forming the antenna comprises:
forming a first conductive material layer on the encapsulant, wherein a thickness of the first conductive material layer is less than a depth of the recess;
forming a second conductive material layer on the first conductive material layer;
removing a portion of the first conductive material layer and a portion of the second conductive material layer, so as to form the antenna.

20. The manufacturing method of claim 11, wherein the chip is flip-chip mounted on the circuit board.

* * * * *